US009350294B2

(12) United States Patent
Calhoun et al.

(10) Patent No.: US 9,350,294 B2
(45) Date of Patent: May 24, 2016

(54) LOW VOLTAGE CRYSTAL OSCILLATOR (XTAL) DRIVER WITH FEEDBACK CONTROLLED DUTY CYCLING FOR ULTRA LOW POWER

(71) Applicants: Benton Calhoun, Charlottesville, VA (US); Aatmesh Shrivastava, Charlottesville, VA (US)

(72) Inventors: Benton Calhoun, Charlottesville, VA (US); Aatmesh Shrivastava, Charlottesville, VA (US)

(73) Assignee: UNIVERSITY OF VIRGINIA PATENT FOUNDATION, Charlottesville, VA (US)

( * ) Notice: Subject to any disclaimer, the term of this patent is extended or adjusted under 35 U.S.C. 154(b) by 0 days.

(21) Appl. No.: 14/594,814

(22) Filed: Jan. 12, 2015

(65) Prior Publication Data
US 2015/0214894 A1    Jul. 30, 2015

Related U.S. Application Data

(60) Provisional application No. 61/926,014, filed on Jan. 10, 2014.

(51) Int. Cl.
H03B 5/36       (2006.01)

(52) U.S. Cl.
CPC ........ *H03B 5/364* (2013.01); *H03B 2200/0046* (2013.01); *H03B 2200/0082* (2013.01)

(58) Field of Classification Search
CPC .. H03B 5/36; H03B 5/364; H03B 2200/0064; H03B 2200/0062; H03L 5/00
USPC .......................... 331/116 R, 116 FE, 158, 160
See application file for complete search history.

(56) References Cited

U.S. PATENT DOCUMENTS

| 4,117,421 | A | * | 9/1978 | Wiesner ................... 331/116 FE |
|---|---|---|---|---|
| 4,560,959 | A | | 12/1985 | Rokos et al. |
| 5,155,453 | A | | 10/1992 | Ruetz |
| 5,254,961 | A | | 10/1993 | Ruetz |
| 5,477,180 | A | | 12/1995 | Chen |
| 6,166,609 | A | * | 12/2000 | Nakamiya et al. ............. 331/109 |
| 6,278,338 | B1 | * | 8/2001 | Jansson ................... 331/116 FE |
| 7,123,113 | B1 | * | 10/2006 | Brennan et al. ................ 331/158 |

(Continued)

OTHER PUBLICATIONS

F. Zhang, et al., A Batteryless 19uW MICS/ISM-Band Energy Harvesting Body Area Sensor Node SoC, Diagnostic & Therapeutic Technologies for Health, ISSCC 2012, Session 17, 17.4, pp. 298-299 and Fig. 17.4.7, 2012 IEEE International Solid-State Circuits Conference (Feb. 2012).

(Continued)

*Primary Examiner* — Ryan Johnson
(74) *Attorney, Agent, or Firm* — Westerman, Hattori, Daniels & Adrian, LLP

(57) ABSTRACT

A low voltage crystal oscillator (XTAL) driver with feedback controlled duty cycling for ultra low power biases an amplifier for an XTAL in the sub-threshold operating regime. A feedback control scheme can be used to bias the amplifier for an XTAL biased in the sub-threshold operating regime. The amplifier of a XTAL oscillator can be duty cycled to save power, e.g., the XTAL driver can be turned off to save power when the amplitude of the XTAL oscillation reaches a maximum value in range; but be turned back on when the amplitude of the XTAL oscillation starts to decay, to maintain the oscillation before it stops. In addition or alternatively, a feedback control scheme to duty cycle the amplifier of a XTAL oscillator can be used to monitor the amplitude of the oscillation.

19 Claims, 13 Drawing Sheets

(56) References Cited

U.S. PATENT DOCUMENTS

| | | | |
|---|---|---|---|
| 7,522,010 | B2 | 4/2009 | Liang et al. |
| 8,120,439 | B2 | 2/2012 | Shrivastava et al. |
| 8,134,413 | B2 | 3/2012 | Filipovic et al. |
| 8,525,603 | B2 * | 9/2013 | Hung ................ 331/116 FE |
| 8,729,971 | B2 * | 5/2014 | Kubota ............. 331/116 FE |
| 2003/0025566 | A1 | 2/2003 | Rogers |
| 2003/0132741 | A1 | 7/2003 | Senthilkumar et al. |
| 2010/0066458 | A1 | 3/2010 | Liu et al. |
| 2010/0259335 | A1 | 10/2010 | Martin |
| 2011/0037527 | A1 | 2/2011 | Shrivastava et al. |
| 2012/0098609 | A1 | 4/2012 | Verma et al. |
| 2012/0161889 | A1 | 6/2012 | Ozawa et al. |
| 2013/0265116 | A1 | 10/2013 | Su |
| 2014/0035689 | A1 * | 2/2014 | Ozawa et al. .......... 331/158 |

OTHER PUBLICATIONS

D. Yoon, et al., A 5.58nW 32.768kHz DLL-Assisted XO for Real-Time Clocks in Wireless Sensing Applications, Analog Techniques, ISSCC 2012, Session 21, 21.5, pp. 366-367 and Fig. 21.5.7, 2012 IEEE International Solid-State Circuits Conference (Feb. 2012).

E. Vittoz, et al., CMOS Analog Integrated Circuits Based on Weak Inversion Operation, IEEE Journal of Solid-State Circuits, vol. SC-12, No. 3, pp. 224-231 (Jun. 1977).

W. Thommen, An Improved Low Power Crystal Oscillator, IEEE Solid-States Circuits Conference, pp. 146-149 (Sep. 1999).

PCT international Search Report and Written Opinion in corresponding PCT/US2015/011012 dated Apr. 29, 2015.

* cited by examiner

LOW VOLTAGE CRYSTAL OSCILLATOR (XTAL) DRIVER WITH FEEDBACK CONTROLLED DUTY CYCLING FOR ULTRA LOW POWER

PRIORITY CLAIMS

The instant application is a non-provisional of and claims priority under 35 U.S.C. §119 to U.S. Provisional Application Ser. No. 61/926,014, entitled "A Low Voltage Crystal Oscillator (XTAL) Driver With Feedback Controlled Duty Cycling For Ultra Low Power," filed Jan. 10, 2014, which is herein expressly incorporated by reference.

FIELDS

Some embodiments generally relate to low power circuit designs, and more particularly, relate to a low voltage XTAL driver with feedback controlled duty cycling for ultra low power.

BACKGROUND

Portable systems that operate from a battery and/or from power harvested from the environment typically need to consume small amounts of energy to prolong the system lifetime for a given amount of available energy. The energy budget for a portable system is increasingly important in a widening set of applications due to a combination of requirements for smaller size (less battery volume, so less energy available), longer lifetimes (make energy last longer), and/or more functionality (do more with the same amount of energy).

Many portable electronic devices such as wireless sensor nodes further typically spend a large fraction of their time in sleep modes waiting for external or internal stimuli to awaken them. During these sleep (or standby) modes, many devices use a stable clock source for keeping time to reduce the cost of re-synchronizing to other radios, among other reasons. During active modes, an accurate timing reference is used for bias precise data sampling, RF modulation, and synchronous digital computation, among other reasons.

One known approach to provide an accurate clock source includes using a crystal oscillator (XTAL). XTAL-based oscillators can consume an appreciable portion of available system power, especially during standby modes. For example, an energy harvesting body sensor network (BSN) SoC (system on a chip) having a 200 kHz XTAL consumes 19 μW while measuring ECG, extracting heart rate, and sending RF packets every few seconds. F. Zhang, Y. Zhang, J. Silver, Y. Shakhsheer, M. Nagaraju, A. Klinefelter, J. Pandey, J. Boley, E. Carlson, A. Shrivastava, B. Otis, and B. H. Calhoun, "A Battery-less 19 μW MICS/ISM-Band Energy Harvesting Body Area Sensor Node SoC," ISSCC Dig. Tech. Papers, pp. 298-299, 2012, which is incorporated by reference. In this example, over 2 μW of the total power consumption is consumed by the 200 kHz XTAL. Id.

Thus, a need exists for a method to produce an accurate clock signal from a XTAL oscillator at much lower power levels that are compatible with miniaturized ultra low power electronics.

SUMMARY

Systems, methods, and apparatus for operating a crystal oscillator (XTAL) at very low voltage, e.g., even into the sub-threshold operating regime of the metal-oxide-semiconductor (MOS) transistors, are described. In some embodiments, a calibration scheme optimizes the XTAL driver for operation at low voltages. To achieve further power savings, the XTAL driver can include a feedback-controlled mode that duty cycles the XTAL while maintaining a stable output clock. Some embodiments disclosed herein include an apparatus that has a XTAL driver, which has an amplifier with MOS transistors. The XTAL driver is configured to produce an operating signal to operate a XTAL while the MOS transistors are operated at a sub-threshold operating regime. The apparatus also includes a feedback control unit that is operatively coupled to the XTAL driver. The feedback control unit is configured to receive the operating signal from the XTAL driver, the feedback control unit configured to generate an adjustment signal based on the operating signal. The XTAL driver is further configured to adjust circuit level properties of the XTAL driver in response to the adjustment signal such that a negative resistance of the amplifier of the XTAL driver is calibrated to a value for operation of the MOS transistors at the sub-threshold operating regime.

Some embodiments disclosed herein include an apparatus that has a XTAL, which is configured to operate at a sub-threshold operating regime of MOS transistors to generate an oscillation. The apparatus further includes a XTAL driver communicatively coupled to the XTAL, which is configured to generate a duty cycle signal to modulate an envelope of the oscillation. The apparatus further includes a feedback control unit communicatively coupled to the XTAL driver and the XTAL, which is configured to use feedback from the oscillation to repeatedly turn on the XTAL driver when an amplitude of the envelope of the oscillation decays to a minimum value and turn off the XTAL driver when the amplitude of the envelope of the oscillation reaches a maximum value.

Some embodiments disclosed herein include a method for duty cycling a XTAL. The method performs the following: obtaining measurements of a rise time and a fall time of a XTAL oscillation envelope; sending an initiation signal to the XTAL to initiate an XTAL oscillation that is configured to reach a maximum amplitude; and repeatedly performing sending a first signal to turn off the XTAL driver for a first time proportional to the fall time of the XTAL oscillation envelope, and sending a second signal to turn on the XTAL driver for a second time proportional to the rise time of the XTAL oscillation envelope. The first time and the second time are relative to growing and decaying delays of the XTAL oscillation envelope such that the XTAL oscillation is preserved.

DETAILED DESCRIPTION

The low voltage crystal oscillator (XTAL) driver with feedback controlled duty cycling for ultra low power bias an amplifier for an XTAL in the sub-threshold operating regime. Alternatively, a feedback control scheme can be used to bias the amplifier for an XTAL biased in the sub-threshold operating regime.

In some embodiments, the amplifier of a XTAL oscillator can be duty cycled to save power. For example, a XTAL driver (e.g., the amplifier 105, which includes metal-oxide-semiconductor (MOS) transistors) can be turned off to save power when the amplitude of the XTAL oscillation reaches a maximum value in range but be turned back on when the amplitude of the XTAL oscillation starts to decay. This allows the XTAL oscillator to maintain the oscillation before it stops. In addition or alternatively, a feedback control scheme to duty cycle the amplifier of a XTAL oscillator can be used to monitor the amplitude of the oscillation.

Figure 1:
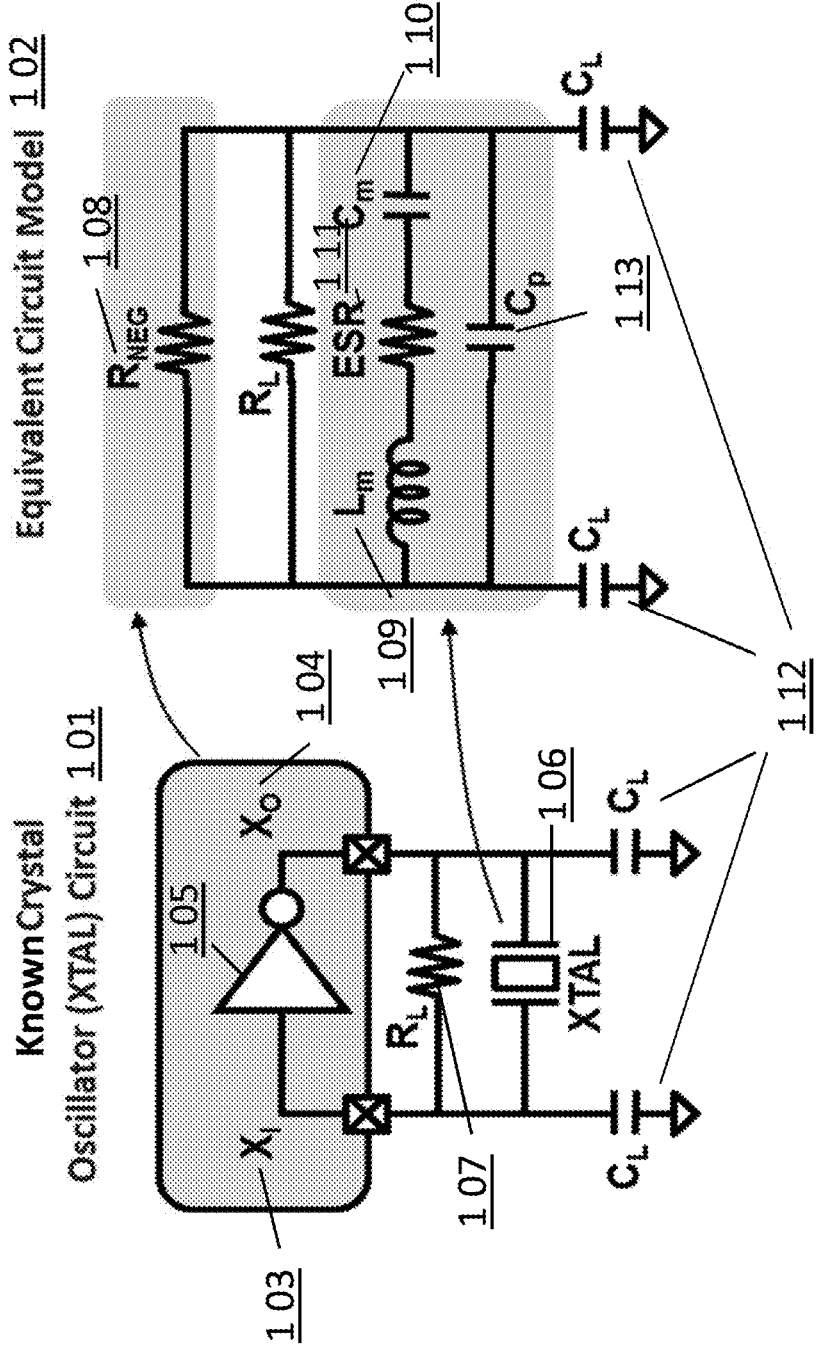
FIG. 1 is a diagram showing a known XTAL circuit and its equivalent circuit schematic.

FIG. 1 shows the architecture (e.g., 101) and equivalent circuit (e.g., 102) for a known XTAL implementation for oscillation in parallel mode. In parallel mode, the crystal oscillator XTAL 106 appears as an inductor 109 and oscillates with the load capacitors $C_L$ 112. The equivalent circuit of the XTAL itself is a series RLC circuit with a parallel parasitic capacitance Cp 113. The quality factor (Q) of a crystal oscillator is in the range of 50,000, which provides a precise frequency output. The inverting amplifier 105 presents a negative resistance 108 to the applied ac current to overcome the damping effect of crystal's equivalent series resistance (ESR) 111 in the RLC circuit of FIG. 1. To oscillate, the circuit can meet the Barkhausen criteria of oscillation by making the negative resistance 108 of the amplifier greater than the ESR 111 of the crystal. The value of the negative resistance 108 is a function of frequency. The ESR 111 of the crystal represents an energy dissipating component, and the amplifier 105 compensates for this dissipation through its negative resistance 108 by supplying/replenishing the dissipated energy in the crystal.

The power consumption of the XTAL circuit is determined by the XTAL 106 and the design of the amplifier 105. The energy dissipating component in crystal oscillator 106 represented by is the crystal's ESR 111. ESR 111 represents the dissipation of energy in the form of heat loss and is given by $I^2R$, where R is the value of resistance of the crystal's ESR 111, and I is the RMS (Root Mean Square) current flowing into the crystal. This loss is directly proportional to the amplitude of oscillation. To reduce the loss and hence to reduce the power consumption of the crystal oscillator 106, often the amplitude of oscillation is reduced. This can be done by operating the amplifier 105 in sub-threshold region. E. Vittoz, and J. Fellarath, "CMOS Analog Integrated Circuits Based on Weak Inversion Operations," IEEE Journal of Solid State Circuits, vol. 12 no. 3 pp 224-231 June 1977; and W. Thommen, "An improved Low Power Crystal Oscillator," IEEE European Solid State Circuits Conference, 1999; each of which is incorporated by reference. Known circuit techniques reduce the amplitude of oscillation by using a delay locked loop (DLL) or by simply quenching the oscillation amplitude. D. Yoon, D. Sylvester, and D. Blaauw, "A 5.58 nW 32.768 kHz DLL-Assisted XO for Real-Time Clocks in Wireless Sensing Applications" IEEE International Solid State Circuits Conference, 2012; W. Thommen, "An improved Low Power Crystal Oscillator," IEEE European Solid State Circuits Conference, 1999; each of which is incorporated by reference. These techniques have reduced the power consumption of 32 kHz crystal oscillator to 5.58 nW making it possible to use the crystal oscillator for wireless sensors, where a lower power clock is desired.

In contrast to these known circuit techniques, described herein are systems, methods, and apparatus for operating a crystal oscillator (XTAL) at very low voltage, even into the sub-threshold operating regime of the MOS transistors (of the amplifier 105 for example). In some embodiments, calibration scheme optimizes the XTAL driver (e.g., the amplifier 105) for operation at low voltages. To achieve further power savings, the XTAL driver can include a feedback controlled mode (not shown in FIG. 1; see 202 in FIG. 2, 303 in FIG. 3, 403 in FIG. 4, etc.) that duty cycles the XTAL 106 while maintaining a stable output clock.

As discussed further below, a compensated amplifier can maintain oscillation at low voltage and a feedback controlled duty cycling scheme can reduce power.

The amplifier 105 for the XTAL 106 can meet the Barkhausen oscillation criterion at low voltage to ensure oscillation of the XTAL. Various inverting amplifier architectures can be used to implement the amplifier. A simple push-pull inverter (a digital inverter) with a big bias resistor 107 shown in FIG. 1 can be used: for example, it is single stage and consumes less power. W. Thommen, "An improved Low Power Crystal Oscillator," IEEE European Solid State Circuits Conference, 1999. Sizing the driver to maintain the correct negative resistance at low supply voltage can be a challenge. At lower driver strength (smaller sizes for nMOS and pMOS), the negative resistance 108 of the amplifier 105 is lower and cannot meet the oscillation criterion. Increasing the driver transistor sizes increases the negative resistance, but the negative resistance starts decreasing again at some point with increasing size because of the self-loading in the inverter. Also, increasing the size of the inverter increases the power consumption.

Figure 2:
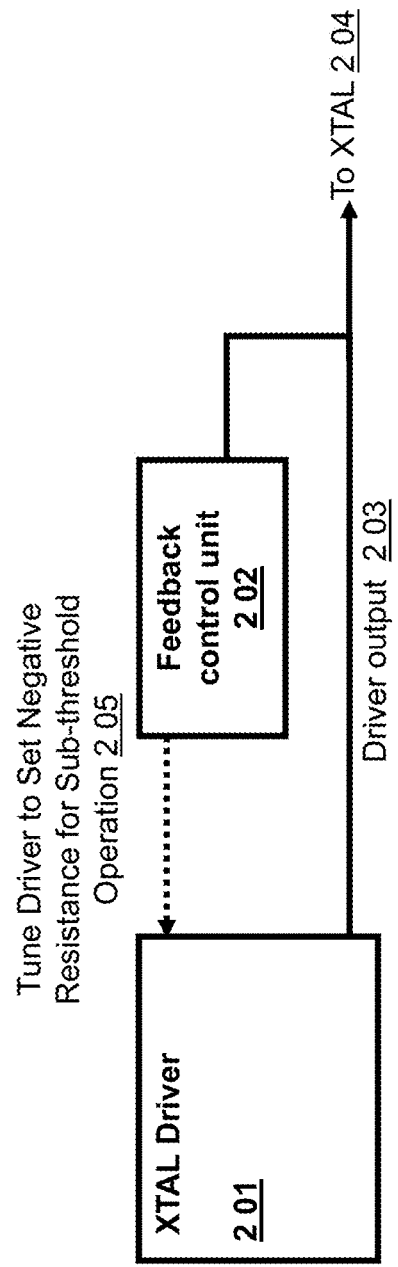
FIG. 2 shows a block diagram of a feedback scheme that uses information from the output of a XTAL driver operating at low voltage, including into the sub-threshold region, according to an embodiment.

Open loop sizing of the amplifier 105 is unlikely to produce a functioning XTAL circuit 101 with high yield in sub-threshold regime due to the impact of process variations, which have an exponential impact on the transistor resistance in this operating region. To support operation at low voltage, some embodiments disclosed herein use a calibration method to address this variation. FIG. 2 shows a block diagram of a feedback scheme that uses information from the output of a XTAL driver 201 (the XTAL 204 may or may not be attached and oscillating) operating at low voltage, including into the sub-threshold regime, to adjust the circuit level properties of the XTAL driver 201 such that its negative resistance is calibrated to the correct (or desired or predefined) value. For example, the feedback circuit includes a feedback control unit 202 that receives the driver output 203 from the XTAL driver 201. The driver output 203 can be used by the feedback control unit 202 to determine the current status of the oscillation, e.g., amplitudes of the oscillation, power consumption, etc. The feedback control unit 202 can then send a signal to the XTAL driver 201 to tune the XTAL driver 201 to set negative resistance for sub-threshold operation of the XTAL 204, e.g., at 205.

Figure 3:
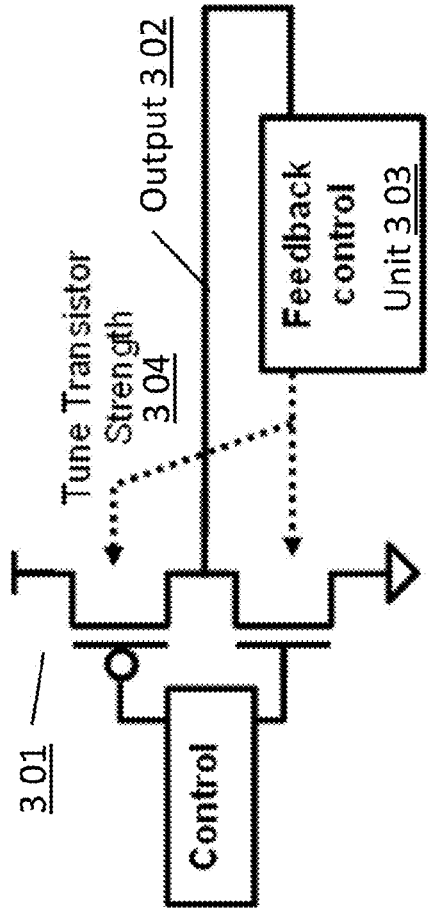
FIG. 3 is a block diagram of a system that can use a calibration method to size the XTAL driver for operation at very low supply voltages, according to an embodiment.

FIG. 3 shows a block diagram of circuit implementation of a feedback system using the calibration scheme shown in FIG. 2 for sub-threshold operation regime of a XTAL, according to an embodiment. As shown in FIG. 3, the output 302 of the inverter 301 can be sent to a feedback control unit 303 (e.g., which could be the equivalent of 202 in FIG. 2) used to set or generate a feedback control signal that tunes the MOS transistor strength to adjust the resistance of the inverter, e.g., at 304.

Figure 4:
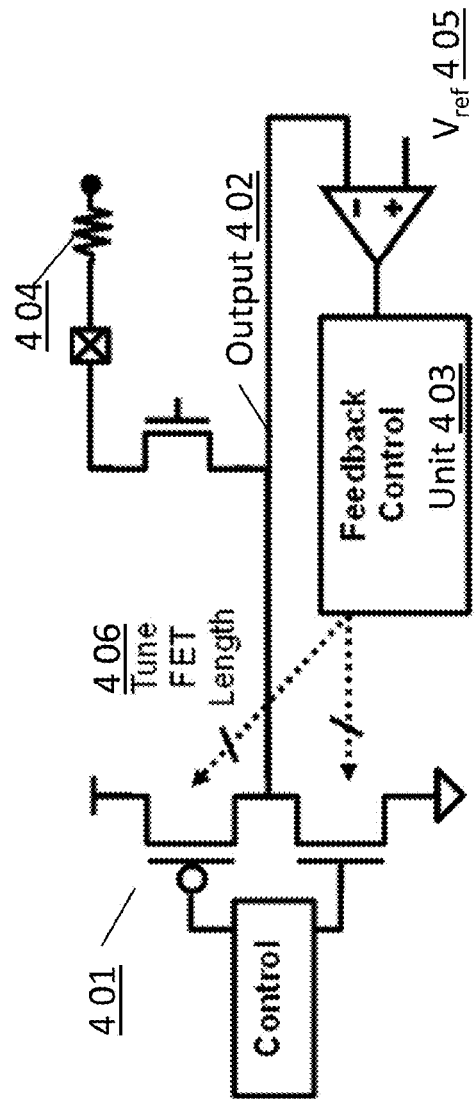
FIG. 4 is a block diagram of a system that can use a calibration circuit that sizes the XTAL driver for operation at very low supply voltages, according to an embodiment.

FIG. 4 shows a system block diagram of an alternative circuit implementation of the feedback system for sub-threshold operation of a XTAL as shown in FIG. 2, e.g., by connecting the inverter output 402 to an off-chip resistor 404 with a reference value of resistance, according to an embodiment. The inverter output 402 is compared to a voltage reference 405 and the result is used by the feedback control unit 403 (e.g., equivalent to 202 in FIG. 2) to set (or generate) a control signal that adjusts the effective lengths of the MOS transistors of the inverter 401, e.g., at 406. A similar scheme could use an on-chip resistance for calibration.

Figure 5:
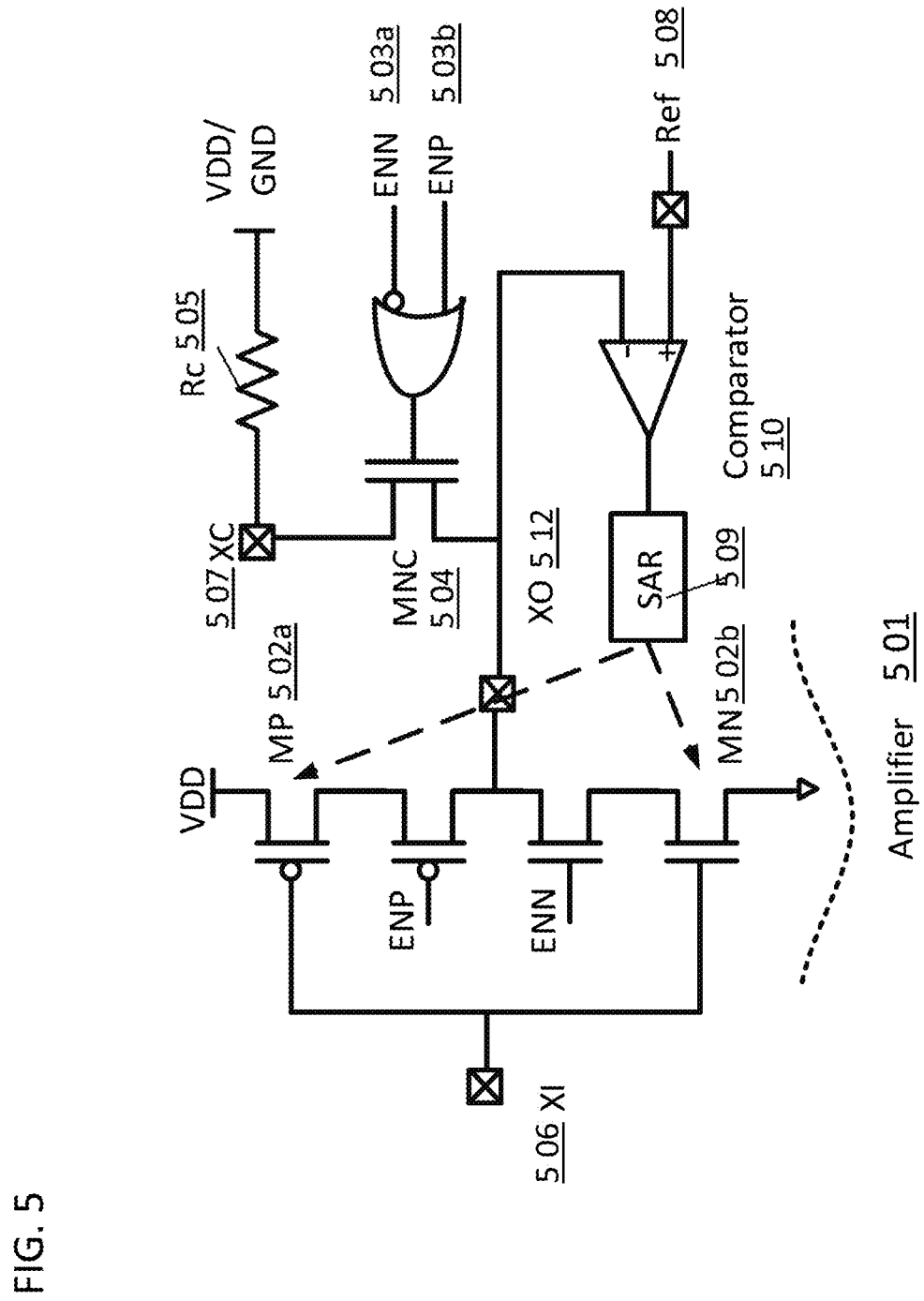
FIG. 5 shows a circuit diagram of an example of the calibration circuit that sizes the XTAL driver for operation at very low supply voltages, according to an embodiment.

FIG. 5 shows a more detailed circuit schematic of an example of the calibration scheme shown in FIG. 4 to set the drive strength of the amplifier transistors MP 502a and MN 502b. The amplifier 501 is enabled when ENP (503b)=0 and ENN (503a)=1. For calibration of MN 502b to a given drive strength, ENN 503a and ENP 503b are set to one. This enables the calibration circuit and connects MN 502b to an external resistor Rc 505 through the switch MNC 504. Oscillating signal XI 506 (e.g., equivalent to 103 in FIG. 1) to the amplifier 501 is connected to Ref 508, which is selected to be at $V_{DD}/2$ to tune for a balanced inverter voltage transfer characteristic. The size of transistor MN 502b is changed using the successive approximation register (SAR) 509 logic and the comparator 510 in the feedback loop. This can happen in the following way. Oscillating signal XI 506 and Ref 508 are set to $V_{DD}/2$, and the pull-down path is enabled while the pull-up path is disabled. The external resistor Rc 505 is connected to $V_{DD}$. If the size of MN 502b is very big, then it will pull down the XO node 512 below Ref 508, which will cause the comparator output to go low. This low signal causes the SAR logic 509 to reduce the size of the transistor MN 502b. The size of MN 502b is successively approximated by turning on or off different fingers of the transistor MN 502b that are binary weighted in size. In this embodiment, the process takes 5 clock cycles, and the algorithm effectively performs a binary search for the right drive strength of the transistor MN 502b set by the external resistor Rc 505. This calibrates MN 502b to the right drive strength, compensating for process variation. Similarly MP 502a is sized by setting ENN 503a and ENP 503b to zero and connecting the external resistor Rc 505 to ground. The size of the external resistor Rc 505 can be used so that the amplifier 501 can be sized to supply 5-20 nA of bias current, which provides enough drive strength to meet Barkhausen criteria for oscillation.

Figure 6:
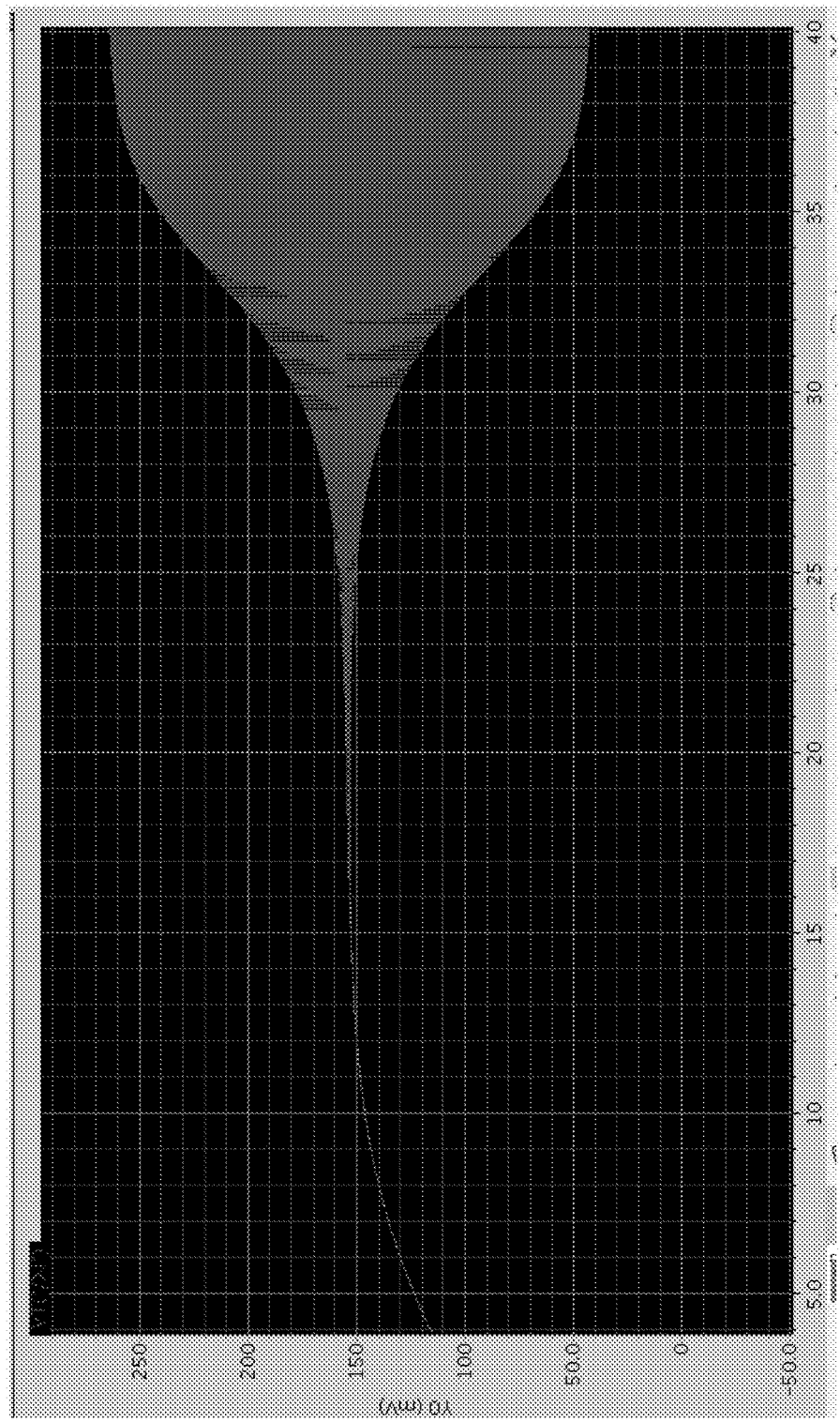
FIG. 6 is an example of simulation result that shows proper startup of one instantiation of a low voltage XTAL driver with a supply voltage of 300 mV.

FIG. 6 shows a simulation result of an example of the oscillator after calibration (as implemented in various embodiments illustrated in FIGS. 3-5), confirming that it can oscillate at a $V_{DD}$ of 0.3V at a power consumption of ~2 nW.

As discussed below, in addition to or alternative to biasing the amplifier for sub-threshold operation, a feedback controlled duty cycling of the oscillator can be used to measure traits of the XTAL to maintain the oscillation while reducing power. The energy of a crystal oscillator is stored in its equivalent inductor and capacitor. After the saturation of oscillation, the stored energy in crystal's equivalent inductor and capacitor is saturated. If the amplifier is disabled in this condition, the oscillation will start decaying. The power consumption becomes negligible when the oscillator is disabled. The oscillation does not die right away but instead decays with a time constant given by ESR (e.g., 111 in FIG. 1) and Lm (series inductance, e.g., 109 in FIG. 1) of the crystal. The output of the crystal oscillator is still useful and can be used to provide clock when the output of the crystal oscillator is decaying because the frequency of the output of the crystal oscillator does not drift while the amplitude decays. Therefore, power consumption of crystal oscillator can be further reduced by switching off the amplifier. If the amplitude of the crystal oscillator output is allowed to decrease too far, the oscillation stops, so the amplifier can be turned back on before the oscillation decays too far.

Figure 7:
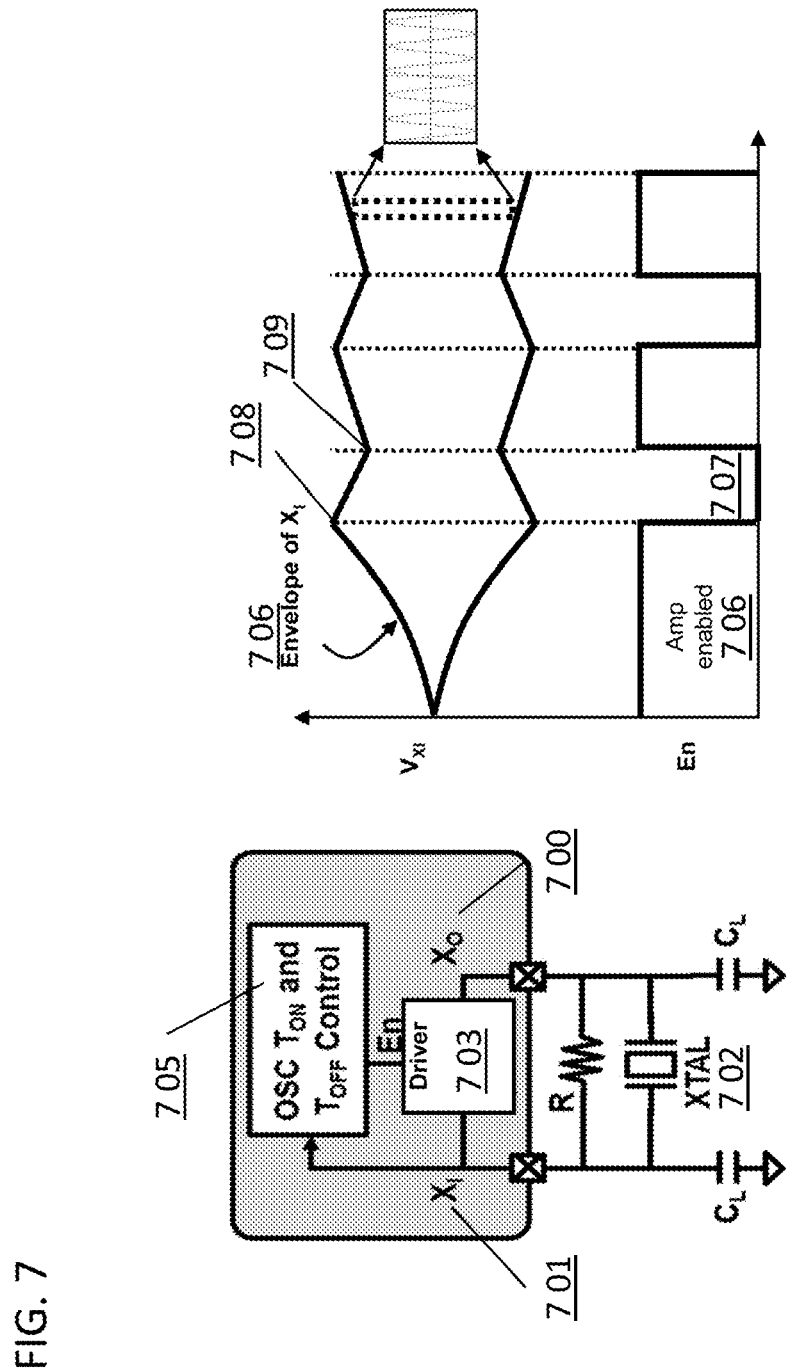
FIG. 7 shows a system block diagram for a XTAL driver and feedback control scheme that uses feedback from the oscillating signal(s) $X_I$ and/or $X_O$ to turn on and off the driver for saving power, and a timing diagram showing how duty cycling can modulate the envelope of $X_I$ (and $X_O$) without stopping oscillation if the duty cycle is controlled relative to the amplitude of the $X_I$ envelope, according to an embodiment.

FIG. 7 shows a system block diagram for a XTAL driver 703 and an oscillation control 705 (e.g., similar to the feedback control unit 202 in FIG. 2) that uses feedback from the oscillating signal(s) $X_I$ 701 and/or $X_O$ 700 to turn on and off the driver 703 for saving power. The feedback The XTAL driver 703 generates a duty cycle signal to modulate an envelope of the oscillation at XTAL 702; and an oscillation control unit 705 uses feedback from the oscillation $X_I$ 701 and/or $X_O$ 700 to periodically turn on and/or off the XTAL driver 703 such that the XTAL driver can be turned off to save power but to be turned on in time before the oscillation stops. For example, as shown in FIG. 7, when the amplifier/driver is enabled (e.g., at 706), the amplitude of the envelope of the oscillation 706 increases; and when the amplifier/driver is disabled (e.g., at 707), the amplitude of the oscillation envelope 706 decreases. Thus, to both save power and sustain the oscillation, the oscillation control unit 705 uses feedback information related to the amplitude of the oscillating signal envelope (e.g., 701 and 700) to ensure the XTAL driver 703 turns back on in time to preserve oscillation, e.g., turning on the amplifier/XTAL driver 703 when the amplitude of the envelope of the oscillation decays to a minimum value (e.g., 709) and turning off the amplifier/XTAL driver 703 when the amplitude of the envelope of the oscillation reaches a maximum value (e.g., 708). In this way, the amplitudes of the envelope of the XTAL oscillation may oscillate between the minimum value 709 and the maximum value 708 so that the XTAL oscillation can be maintained.

Figure 8:
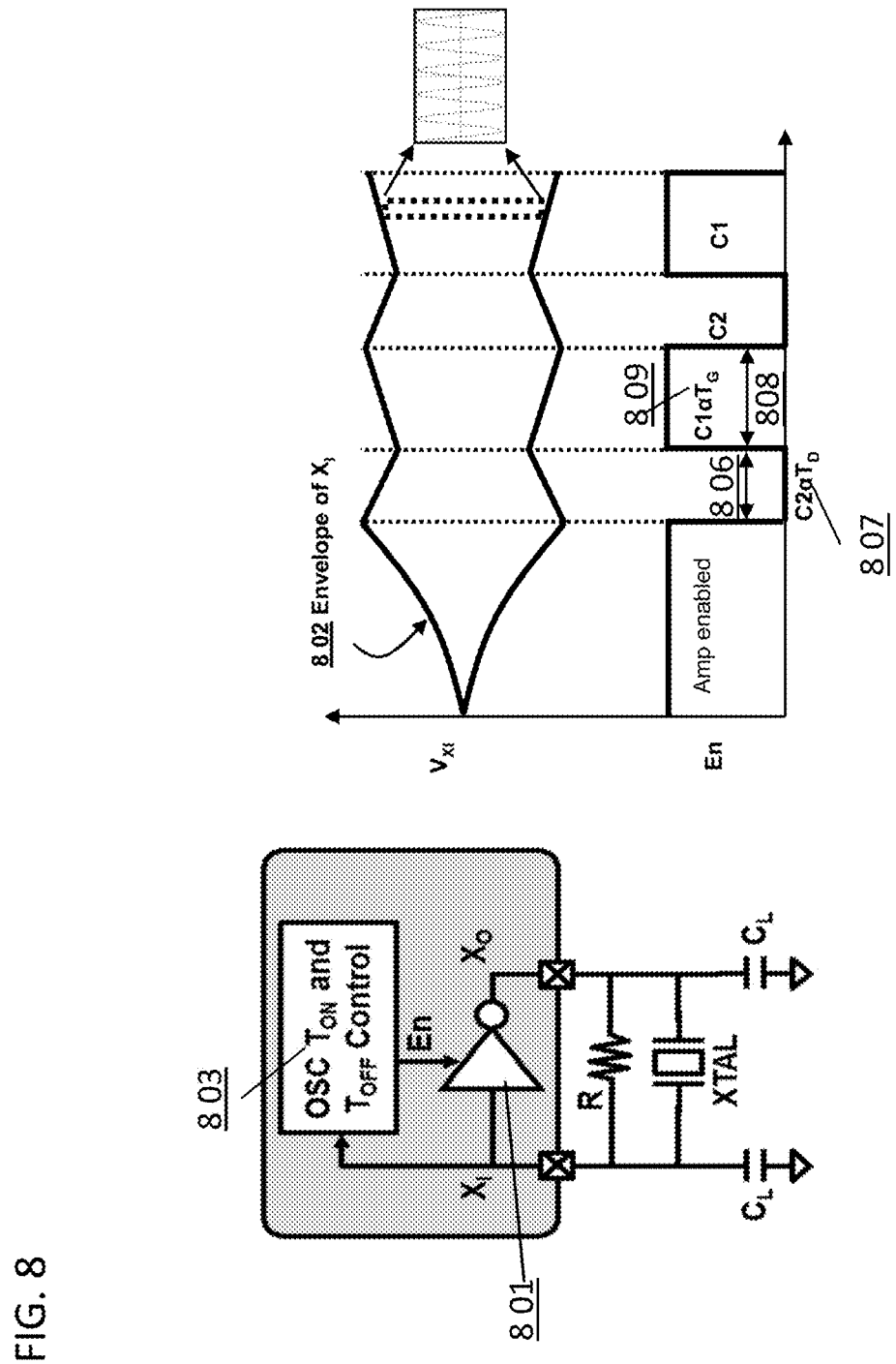
FIG. 8 shows a system block diagram for a system that can control the duty cycle of the XTAL driver by turning it on and off and a timing diagram showing how duty cycling can modulate the envelope of XI without stopping oscillation if the duty cycle is controlled relative to the growing and decaying delays ($T_G$ and $T_D$, respectively) of the $X_I$ envelope, according to an embodiment.

FIG. 8 shows a system block diagram and a timing diagram for a system and scheme that uses feedback to duty cycle the XTAL amplifier for power savings while ensuring that the oscillation remains intact, according to an embodiment. The amplifier 801 is switched periodically while keeping the amplitude of oscillation high enough for the receiver circuit to detect oscillation. When the amplifier 801 is disabled (e.g., at 806), the oscillation at $X_I$ 802 will decay with a time constant ($T_D$) 807, which is determined by the ESR (e.g., 111 in FIG. 1) and Lm (e.g., 109 in FIG. 1). When the amplifier 801 is enabled again during 808, the amplitude of the XTAL oscillation grows with a time constant ($T_G$) 809, which is determined by $R_N$-ESR and Lm. A. Shrivastava, R. Yadav, and P. K. Rana, "Fast Start-up Crystal Oscillator," U.S. Pat. No. 8,120,439, which is incorporated by reference. For optimal power savings, the amplifier 801 should be disabled for time proportional to $T_D$ 807 and enabled for time proportional to $T_G$ 809 as shown in FIG. 8. Other control scheme embodiments are possible, including direct comparison of the oscillation envelope amplitude or maximum/minimum values with voltage references.

The feedback control unit (labeled "OSC $T_{ON}$ and $T_{OFF}$ Control") 803 in FIG. 8 measures $T_G$ and $T_D$. A counter running based on the oscillator output frequency is enabled when the amplitude of the crystal oscillator (XTAL) output crosses a set threshold. The counter counts until C1 and stops when the amplitude of the crystal oscillator output crosses a higher threshold. This results in a digital output pulse proportional to $T_G$. Similarly, a pulse with width C2 proportional to $T_D$ can be obtained. The feedback circuit can produce a clock with the period (C1+C2), with C1 as the high phase width and C2 as the low phase width, as shown in FIG. 8. The proposed technique enables a calibrated switching of the amplifier 801 of the crystal oscillator XTAL and reduces the power to near 1 nW or below.

Figure 9:
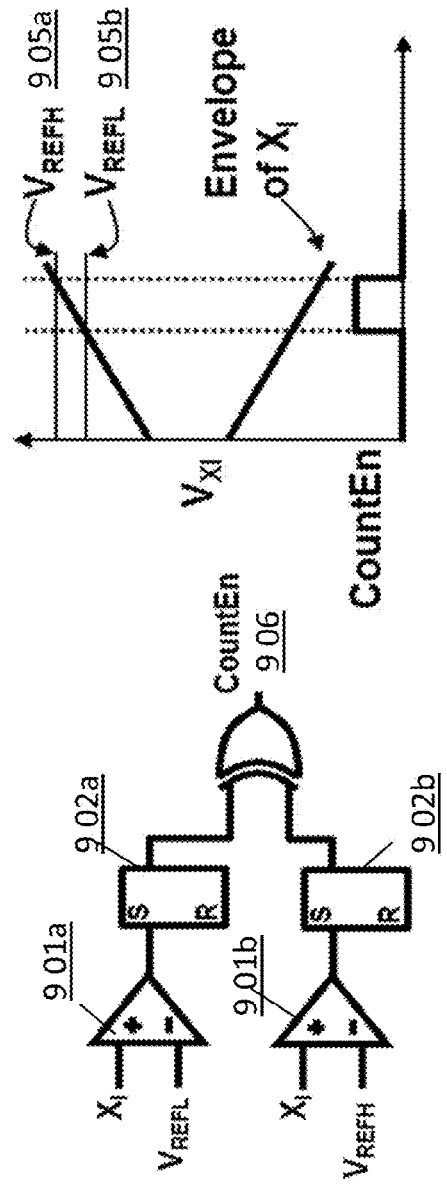
FIG. 9 shows a block diagram of a circuit to measure the rising delay, $T_G$, of the oscillation envelope of $X_I$, according to an embodiment.

FIG. 9 shows a circuit to measure $T_G$ (e.g., the circuit implementation may be part of the oscillation control unit 803 in FIG. 8) and a timing diagram showing the growing amplitude of the envelope of XTAL oscillation, according to an embodiment. The circuit includes comparators 901a-b and SR flip-flops 902a-b. Threshold voltages $V_{REFH}$ 905a (e.g., 220 mV for $V_{DD}$=0.3V) and $V_{REFL}$ 905b (e.g., 200 mV for $V_{DD}$=0.3V) are applied at the negative terminal of the respective comparator, while $X_I$ is applied at the positive terminal of each comparator. Once the oscillation's amplitude goes above $V_{REFL}$, the output of the upper comparator 901a goes high, and the corresponding SR flip-flop 902a is set. This sets CountEn 906 to high. A counter (not shown) is enabled using this signal, and the counter starts counting. The amplitude of oscillation continues increasing. Once the oscillation crosses $V_{REFH}$ 905a, the lower comparator 901b goes high, the corresponding SR flip-flop 902b is set and sets CountEn 906 is set to zero. This stops the counter and sets the value of the counter, which is proportional to the growth of oscillation. The value of the counter is digital and is stored, while the circuit in FIG. 9 is disabled to save power. The proposed circuit consumes power only when the count value is needed.

Figure 10:
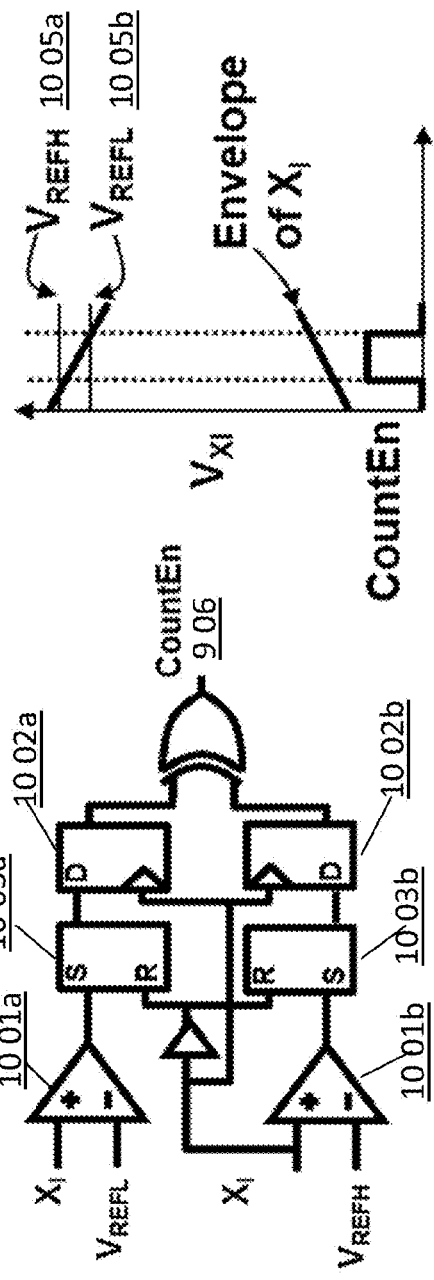
FIG. 10 shows a block diagram showing a circuit to measure the falling delay, $T_D$, of the oscillation envelope of $X_I$, according to an embodiment.

FIG. 10 shows the circuit implementation for obtaining $T_D$ for the oscillator (e.g., the circuit implementation may be part of the oscillation control unit 803 in FIG. 8) and a timing diagram showing the decaying amplitude of the envelope of XTAL oscillation, according to an embodiment. The circuit in FIG. 10 is very similar to the circuit used for obtaining $T_G$ shown in FIG. 9, except that two additional D flip-flops 1002a-b are included to capture negative triggers. For example, when the oscillation's amplitude decays below $V_{REFH}$ (1005a), the output of the lower comparator 1001b goes low, and the corresponding SR flip-flop 1003b is set and thus the D flip-flop 1002a is set high. This sets CountEn 906 to high to enable a counter to start counting. When the amplitude of oscillation continues decaying and crosses $V_{REFL}$ 1005b, the upper comparator 1001a goes low, and thus the corresponding SR flip-flop 1003a is set, and the D flip-flop 1002a has a same output value as that of 1002b. This way, CountEn 906 is set to zero. This stops the counter and sets the value of the counter, which is proportional to the decay of oscillation.

It also enables a counter that counts when $X_I$ is between $V_{REFH}$ 1005a and $V_{REFL}$ 1005b. While $T_G$ (e.g., 809 in FIG. 8) is obtained when the amplifier (e.g., 801 in FIG. 8) is enabled, $T_D$ (e.g., 807 in FIG. 8) is obtained when the amplifier (e.g., 801 in FIG. 8) is disabled. Both $T_G$ and $T_D$ are stored digitally and their corresponding circuits are disabled to save power. After obtaining $T_G$ and $T_D$, the oscillator control (e.g., 803 in FIG. 8) turns on the amplifier (e.g., 801 in FIG. 8) for a time proportional to $T_D$ and turns it off for a time proportional to $T_G$. This duty cycling of the amplifier saves power, and the feedback scheme protects the oscillation and ensures the oscillation remains intact. The total power consumption can be, for example, goes below 1 nW.

Figure 11:
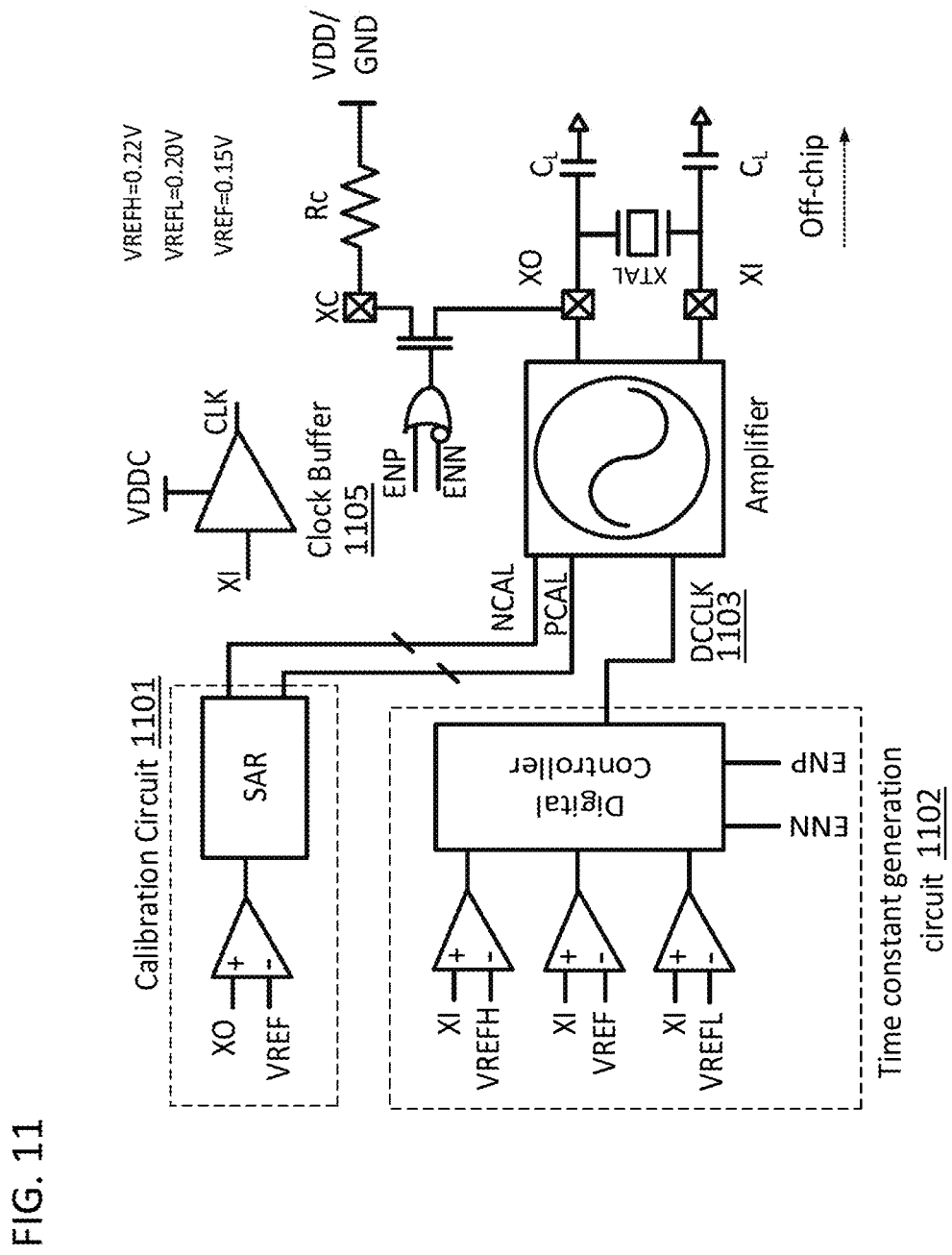
FIG. 11 shows a circuit schematic of an example of the complete XTAL oscillator system.

FIG. 11 shows the complete circuit diagram of an example of the proposed crystal oscillator circuit (e.g., a circuit implementation of the XTAL circuit shown in FIGS. 7-8). First, the calibration of the amplifier (e.g., 801 in FIG. 8) is performed at a calibration circuit 1101. The calibration of the amplifier can be performed once after manufacturing or more often to compensate for environmental changes, for example. The calibration circuit 1101 sets the drive strength of the amplifier and compensates for process variations or other variations. After calibration, the time constant generation circuit 1102 obtains the time of growth $T_G$ and time of decay $T_D$ of the oscillator. These time constants are used to configure the clock, DCCLK 1103, to switch the amplifier on and off. The duty cycle of DCCLK 1103 is determined by $T_G$ and $T_D$ with high time=$T_G$ and low time=$T_D$. Once the DCCLK 1103 is configured, the time constant generation circuit 1102 is disabled. Similarly, calibration circuit 1101 is disabled after calibration, and all the digital bits are stored. This eliminates the power overhead of the calibration circuit 1101 or time constant generation circuit 1102. The power consumption is given by the amplifier with duty cycling. A clock buffer 1105 is used to level convert the clock to higher voltage if needed.

Figure 12:
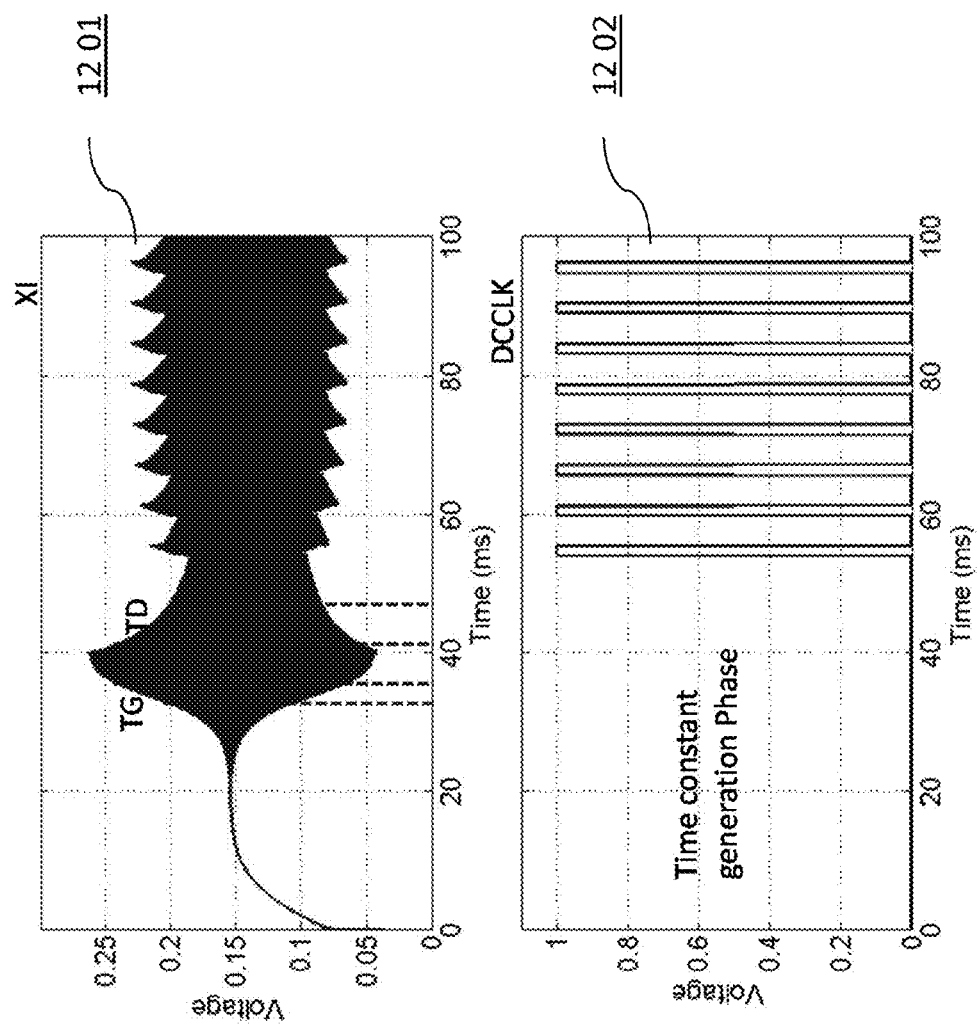
FIG. 12 shows an example of simulations results of the $X_O$ waveform showing the envelope during duty cycled operation and the enable signal waveform.

FIG. 12 shows an example of the simulated results of the XTAL driver, e.g., showing duty cycling of the XTAL amplifier, leading to the saw toothed envelope for the oscillating signal output and saving power. The example XTAL driver in FIG. 12 was implemented in a 130 nm commercial CMOS process and fabricated. The waveform shows successful operation of the circuit at an average power consumption of less than 1 nW and a frequency of 32.768 kHz. For example, chart 1201 shows oscillation with duty cycling of the amplitude, and chart 1202 shows periodic enabling signal (e.g., DCCLK 1103 in FIG. 11) for the XTAL amplifier during oscillation duty cycling.

Figure 13:
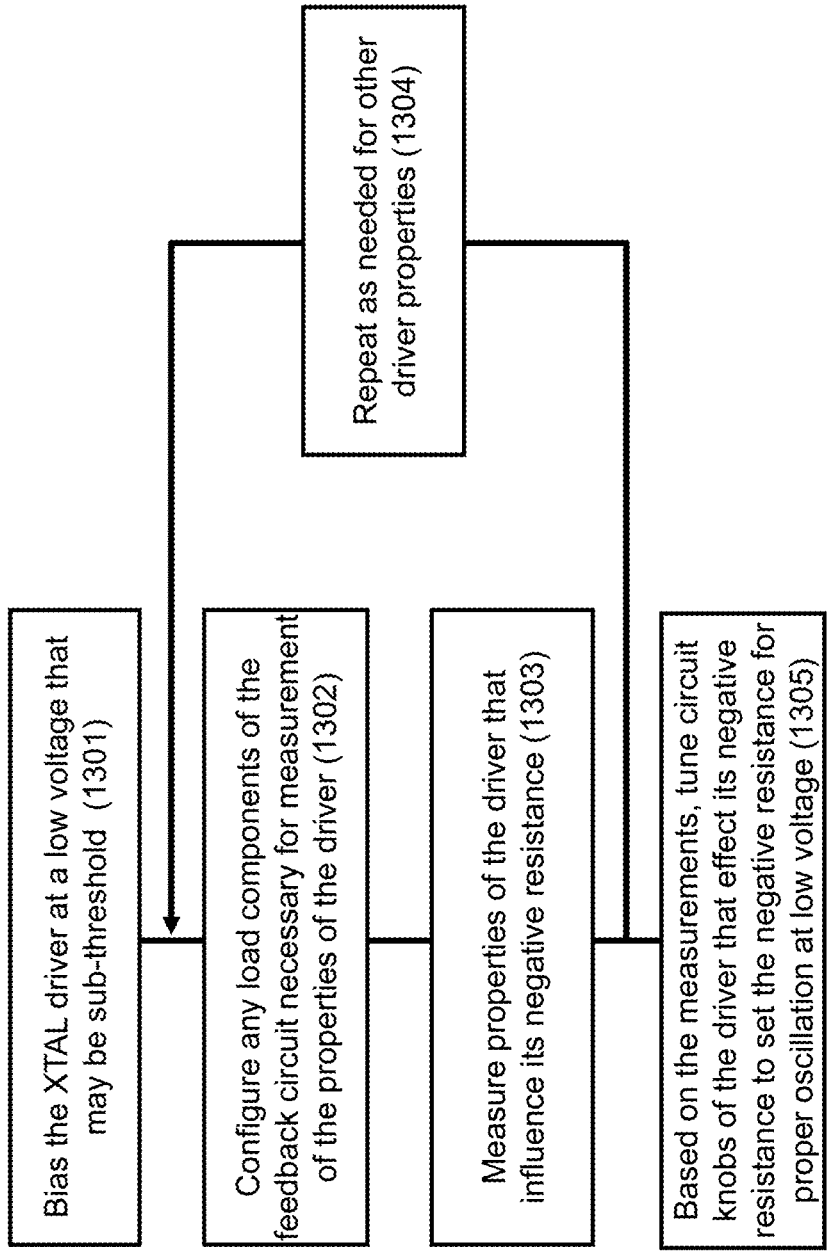
FIG. 13 shows a flowchart for calibrating an XTAL driver for operation at low voltage including the sub-threshold region, according to an embodiment.

FIG. 13 shows a flowchart for calibrating an XTAL driver for operation at low voltage including the sub-threshold region (e.g., as performed by the feedback control unit 202 in FIG. 2), according to an embodiment. A feedback control unit can be included in the XTAL circuit to bias the XTAL driver at a low voltage that may be sub-threshold at 1301, e.g., see the feedback control unit 202 in FIG. 2. The feedback control unit can configure any load components of the feedback circuit (e.g., see FIG. 2) that are used for measurement of the properties of the XTAL driver, at 1302, and then measure circuit properties of the XTAL driver that influence the negative resistance, at 1303, e.g., voltage, current, and/or the like. The feedback control unit may repeat as needed for other driver properties, at 1304, steps 1302-1303 to obtain different driver properties, e.g., amplitudes of the oscillation, etc. Based on the measurements, the control feedback unit can tune the XTAL driver that effects its negative resistance to set the negative resistance for proper oscillation at low voltage, at 1305.

Figure 14:
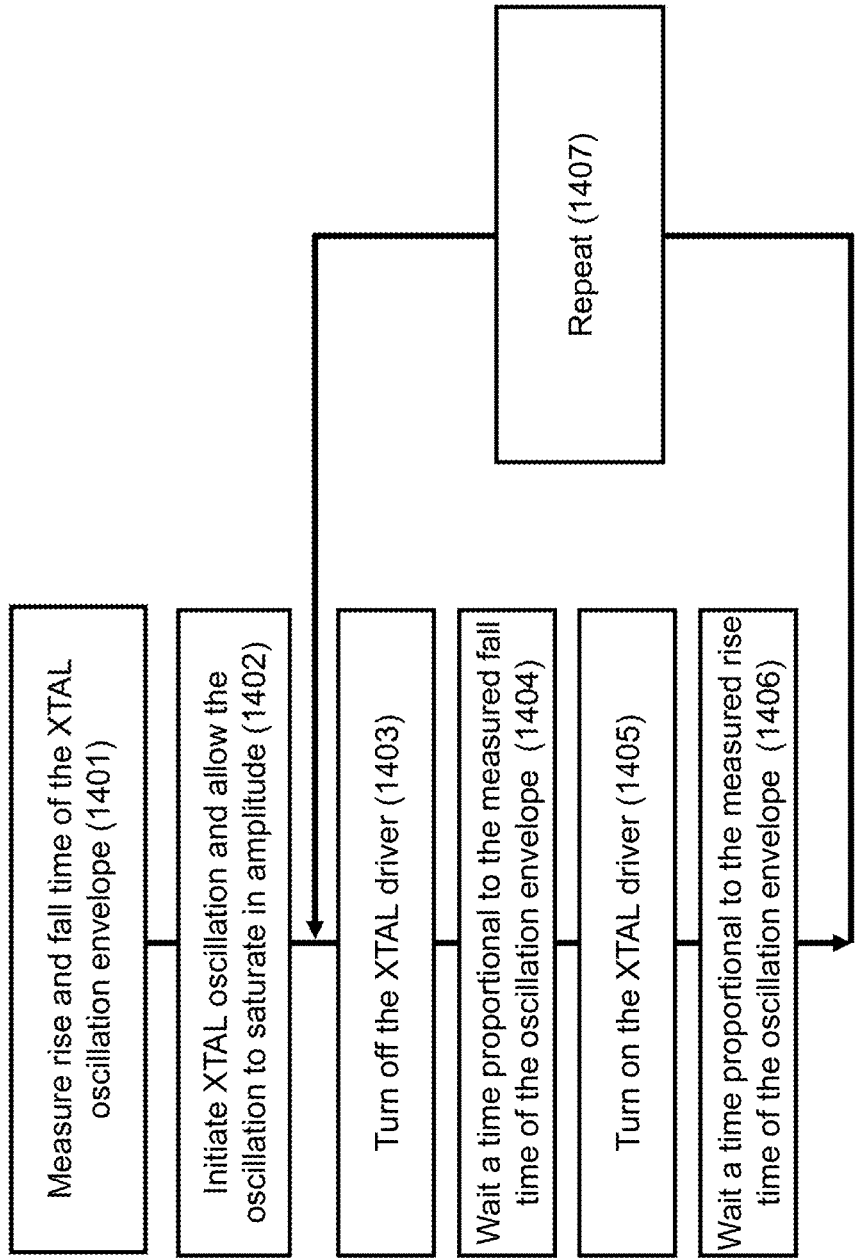
FIG. 14 shows a flowchart for duty cycling the driver for an XTAL while persevering oscillation, according to an embodiment.

FIG. 14 shows a flowchart for duty cycling the driver for an XTAL while persevering oscillation (e.g., as performed by the oscillation control unit 705 in FIG. 7, or 803 in FIG. 8), according to an embodiment. As shown in FIG. 14, anoscillation feedback control unit (e.g., 705 in FIG. 7; 803 in FIG. 8) may measure the rise and the fall times of the XTAL oscillation envelope, at 1401 (e.g., see the rise and the fall of the oscillation envelope in FIGS. 7-8). The oscillation feedback control unit may initiate the XTAL oscillation and allow the oscillation to increase in amplitude at 1402, e.g., by reaching a maximum oscillation amplitude (e.g., see 708 in FIG. 7). The feedback control unit may then turn off the XTAL driver at 1403, so as to save power; and wait a time proportional to the measured fall time of the oscillation envelope at 1404 before turning on the XTAL driver again at 1405. In this way, the feedback control unit keeps the oscillation before the oscillation stops (e.g., before the amplitude of the oscillation diminishes to zero, or to a sufficiently small value such that a receiver circuit cannot detect the oscillation, etc.). The control unit may then wait a time proportional to the measured rise time of the oscillation envelope, at 1406, to wait for the amplitude of the oscillation envelope to reach a maximum value. The turning on and off of the XTAL driver may be performed periodically in a repeated manner at 1407, so as to form a duty cycle to save power and preserve the oscillation.

Figure 15:
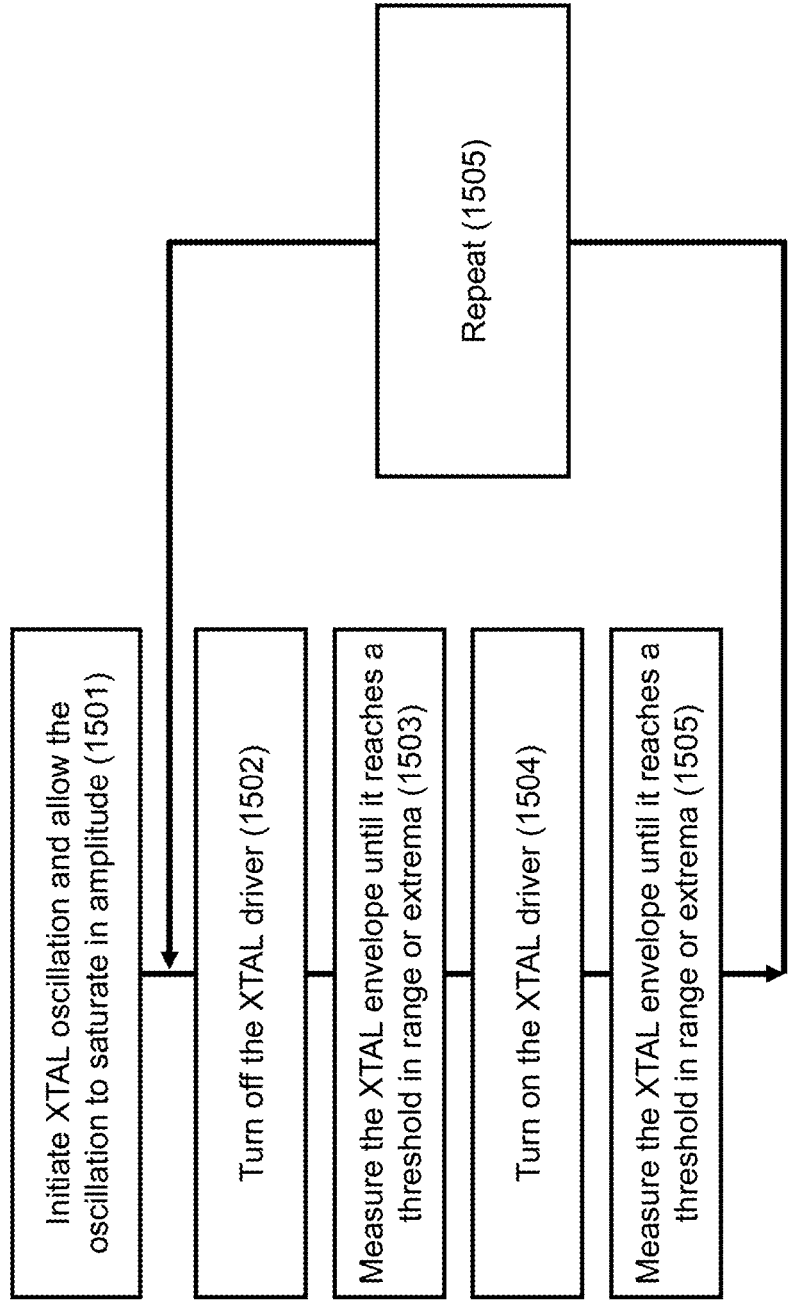
FIG. 15 shows a flowchart for duty cycling an XTAL while persevering oscillation, according to another embodiment.

FIG. 15 shows a flowchart for duty cycling an XTAL while persevering oscillation (e.g., as performed by the oscillation control unit 705 in FIG. 7, or 803 in FIG. 8), according to another embodiment. Similar to the work flow described in FIG. 14, a feedback control unit may initiate the XTAL oscillation and allow the oscillation to increase in amplitude at 1501, and may turn off the XTAL driver at 1502 to save power. The control unit may then measure the XTAL envelope until the XTAL oscillation envelope reaches a threshold in range or extrema at 1503, e.g., the minimum value 709 in FIG. 7, and then turn on the XTAL driver at 1504. The control unit may then measure the XTAL envelope until it reaches a maximum threshold in range or extrema, at 1505, e.g., the maximum value 708 in FIG. 7. The control unit may then monitor the XTAL oscillation and repeatedly turn off/on the XTAL driver as in steps 1502-1505.

In sum, in some embodiments, the amplifier for an XTAL is biased in the sub-threshold operating regime. In addition or alternatively, a feedback control scheme can be used to bias an amplifier for an XTAL biased in the sub-threshold operating regime.

In some embodiments, the amplifier of a XTAL oscillator can be duty cycled to save power while the amplitude of the XTAL oscillation starts to decay but the amplifier can be turned back on to maintain the oscillation before it stops. In addition or alternatively, a feedback control scheme to duty cycle the amplifier of a XTAL oscillator can be used to save power while the amplitude of the XTAL oscillation starts to decay and the amplifier can be turned back on to maintain the oscillation before it stops.

It is intended that some of the methods and apparatus described herein can be performed by software (stored in memory and executed on hardware), hardware, or a combination thereof. For example, the control circuits discussed above can alternatively be control modules or control devices implemented in or including such software and/or hardware. Hardware modules may include, for example, a general-purpose processor, a field programmable gate array (FPGA), and/or an application specific integrated circuit (ASIC). Software modules (executed on hardware) can be expressed in a variety of software languages (e.g., computer code), including C, C++, Java™, Ruby, Visual Basic™, and other object-oriented, procedural, or other programming language and development tools. Examples of computer code include, but are not limited to, micro-code or micro-instructions, machine instructions, such as produced by a compiler, code used to produce a web service, and files containing higher-level instructions that are executed by a computer using an interpreter. Additional examples of computer code include, but are not limited to, control signals, encrypted code, and compressed code.

Some embodiments described herein relate to a computer storage product with a non-transitory computer-readable medium (also can be referred to as a non-transitory processor-readable medium) having instructions or computer code thereon for performing various computer-implemented operations. The computer-readable medium (or processor-readable medium) is non-transitory in the sense that it does not include transitory propagating signals per se (e.g., a propagating electromagnetic wave carrying information on a transmission medium such as space or a cable). The media and computer code (also can be referred to as code) may be those designed and constructed for the specific purpose or purposes. Examples of non-transitory computer-readable media include, but are not limited to, magnetic storage media such as hard disks, floppy disks, and magnetic tape; optical storage media such as Compact Disc/Digital Video Discs (CD/DVDs), Compact Disc-Read Only Memories (CD-ROMs), and holographic devices; magneto-optical storage media such as optical disks; carrier wave signal processing modules; and hardware devices that are specially configured to store and execute program code, such as Application-Specific Integrated Circuits (ASICs), Programmable Logic Devices (PLDs), Read-Only Memory (ROM) and Random-Access Memory (RAM) devices.

While various embodiments have been described above, it should be understood that they have been presented by way of example only, and not limitation. Where methods and steps described above indicate certain events occurring in certain order, the ordering of certain steps may be modified. Additionally, certain steps may be performed concurrently in a parallel process when possible, as well as performed sequentially as described above. Although various embodiments have been described as having particular features and/or combinations of components, other embodiments are possible having any combination or sub-combination of any features and/or components from any of the embodiments described herein.

What is claimed is:

1. An apparatus, comprising:
a crystal oscillator (XTAL) driver having an amplifier with metal-oxide-semiconductor (MOS) transistors, the XTAL driver configured to produce an operating signal to operate a XTAL while the MOS transistors are operated at a sub-threshold operating regime; and
a feedback control unit operatively coupled to the XTAL driver, the feedback control unit configured to receive an output from the XTAL driver, the feedback control unit configured to generate an adjustment signal based on a comparison of the output and a voltage reference to adjust effective lengths of the MOS transistors, the feedback control unit configured to send the adjustment signal to the XTAL driver, the XTAL driver configured to adjust circuit properties of the XTAL driver in response to the adjustment signal such that a negative resistance of the amplifier of the XTAL driver is calibrated to a value for operation of the MOS transistors at the sub-threshold operating regime.

2. The apparatus of claim 1, wherein the feedback control unit is configured to bias the amplifier to be operated at the sub-threshold operating regime.

3. The apparatus of claim 1, wherein the amplifier includes an inverter having the MOS transistors.

4. The apparatus of claim 1, wherein:
the amplifier includes an inverter,
the negative resistance of the amplifier is calibrated by tuning a transistor strength of the inverter based on the output as feedback control.

5. The apparatus of claim 1, further comprising:
an off-chip resistor with a reference value of resistance and operatively coupled to the XTAL driver,
the XTAL driver configured to maintain a voltage reference based on the reference value of the off-chip resistor.

6. The apparatus of claim 1, wherein the value is sufficient to satisfy a condition for XTAL oscillation.

7. An apparatus, comprising:
a crystal oscillator (XTAL) configured to generate an oscillation;
a XTAL driver communicatively coupled to the XTAL, the XTAL driver configured to generate a duty cycle signal to modulate an envelope of the oscillation; and
a feedback control unit communicatively coupled to the XTAL driver and the XTAL, the feedback control unit configured to generate an adjustment signal to adjust effective lengths of metal-oxide-semiconductor (MOS) transistors of the XTAL driver, the feedback control unit configured to use feedback from the oscillation to repeatedly turn on the XTAL driver when an amplitude of the envelope of the oscillation decays to a minimum value and turn off the XTAL driver when the amplitude of the envelope of the oscillation reaches a maximum value.

8. The apparatus of claim 7, wherein the XTAL is configured to operate at a sub-threshold operating regime of metal-oxide-semiconductor (MOS) transistors.

9. The apparatus of claim 7, wherein:
the XTAL driver is configured to modulate the envelope of the oscillation without stopping the oscillation during a duty cycle, and
the feedback control unit turns the XTAL driver on in time to sustain oscillation when the amplitude of the envelope of the oscillation decreases.

10. The apparatus of claim 7, wherein the XTAL driver comprises an amplifier, the amplifier configured to be switched repeatedly while maintaining the amplitude of the envelope of the oscillation above a minimum value.

11. The apparatus of claim 7, wherein the XTAL driver is configured to be turned off for a time proportional to a fall time of the XTAL oscillation.

12. The apparatus of claim 7, wherein the XTAL driver is configured to be turned on for a time proportional to a rise time of the XTAL oscillation.

13. A method for duty cycling a XTAL, comprising:
obtaining measurements of a rise time and a fall time of a XTAL oscillation envelope;
sending an initiation signal to the XTAL to initiate an XTAL oscillation that is configured to reach a maximum amplitude; and
repeatedly performing the following:
sending a first signal to turn off the XTAL driver for a first time proportional to the fall time of the XTAL oscillation envelope, and
sending a second signal to turn on the XTAL driver for a second time proportional to the rise time of the XTAL oscillation envelope;
the first time and the second time being relative to growing and decaying delays of the XTAL oscillation envelope such that the XTAL oscillation is preserved.

14. The method of claim 13, wherein the measurements of the rise time and the fall time of the XTAL oscillation envelope are obtained via a measurement circuit, the measurement circuit having a first comparator configured to set a high value for a counter to start counting when the amplitude of the XTAL oscillation increases, a second comparator configured to set a zero value for the counter to stop counting when the amplitude of the XTAL oscillation decreases.

15. The method of claim 13, further comprising:
monitoring and controlling the first time and the second time relative to the growing and the decaying delays of the XTAL oscillation envelope.

16. The method of claim 13, wherein the XTAL driver operates the XTAL at a sub-threshold operating regime of MOS transistors of the XTAL driver.

17. The method of claim 13, wherein the XTAL driver modulates the XTAL oscillation envelope without stopping the XTAL oscillation during a duty cycle.

18. The method of claim 13, further comprising using feedback from the XTAL oscillation to periodically turn on and off the XTAL driver.

19. The method of claim 13, further comprising:
turning off the XTAL driver until the XTAL oscillation envelope reaches a minimum value;
turning on the XTAL driver until the XTAL oscillation envelope reaches a maximum value; and
repeatedly turning on and off the XTAL driver such that the XTAL oscillation is preserved.

* * * * *